(12) United States Patent
Johnson et al.

(10) Patent No.: US 7,215,148 B1
(45) Date of Patent: May 8, 2007

(54) PROGRAMMABLE CURRENT OUTPUT BUFFER

(75) Inventors: Phillip L. Johnson, Allentown, PA (US); William B. Andrews, Emmaus, PA (US); Gregory S. Cartney, Coplay, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 169 days.

(21) Appl. No.: 11/012,548

(22) Filed: Dec. 15, 2004

(51) Int. Cl.
*H03K 19/0175* (2006.01)

(52) U.S. Cl. .......................................... 326/83; 326/87
(58) Field of Classification Search ............. 326/82–90
See application file for complete search history.

(56) References Cited

U.S. PATENT DOCUMENTS

| | | | | |
|---|---|---|---|---|
| 6,111,431 A | 8/2000 | Estrada | | 326/83 |
| 6,236,238 B1 | 5/2001 | Tanji et al. | | 326/83 |
| 6,281,715 B1 * | 8/2001 | DeClue et al. | | 327/65 |
| 6,433,579 B1 | 8/2002 | Wang et al. | | 326/38 |
| 6,480,026 B2 | 11/2002 | Andrews et al. | | 326/39 |
| 6,639,434 B1 * | 10/2003 | Rahman | | 327/108 |
| 6,975,135 B1 * | 12/2005 | Bui | | 326/29 |
| 6,992,508 B2 | 1/2006 | Chow | | 326/86 |

OTHER PUBLICATIONS

U.S. Appl. No. 10/910,092, filed Aug. 3, 2004.

* cited by examiner

*Primary Examiner*—Don Le
(74) *Attorney, Agent, or Firm*—Steve Mendelsohn

(57) ABSTRACT

A buffer for a programmable device has source current circuitry, sink current circuitry, one or more input nodes, one or more output nodes, and switch circuitry. The source current circuitry can be programmably controlled to generate a plurality of different total source currents, and the sink current circuitry can be programmably controlled to generate a plurality of different total sink currents. The one or more input nodes can receive one or more input signals, and the one or more output nodes can present one or more output signals. The switch circuitry can selectively apply at least one of a total source current and a total sink current to the one or more output nodes based on the one or more input signals.

19 Claims, 2 Drawing Sheets

US 7,215,148 B1

PROGRAMMABLE CURRENT OUTPUT BUFFER

TECHNICAL FIELD

The present invention relates to programmable devices, such as field-programmable gate arrays (FPGAs), and, in particular, to the input/output (I/O) buffer architecture of such devices.

BACKGROUND

Because they are programmable, FPGAs can be configured (i.e., programmed) to support different signal and data processing applications. In order to support different types of applications, FPGAs can be designed with different types of I/O buffers, each different type designed to handle the voltage swing associated with a different I/O standard.

SUMMARY

In one embodiment, the present invention is a programmable device having a buffer, the buffer comprising source current circuitry, sink current circuitry, one or more input nodes, one or more output nodes, and switch circuitry. The source current circuitry is adapted to be programmably controlled to generate a plurality of different total source currents, and the sink current circuitry is adapted to be programmably controlled to generate a plurality of different total sink currents. The one or more input nodes are adapted to receive one or more input signals, and the one or more output nodes are adapted to present one or more output signals. The switch circuitry is adapted to selectively apply at least one of a total source current and a total sink current to the one or more output nodes based on the one or more input signals.

In another embodiment, the present invention is a method and apparatus for processing an input signal to present an output signal at one or more output nodes. A total source current is programmably generated from among a plurality of different supported total source currents, and a total sink current is programmably generated from among a plurality of different supported total sink currents. At least one of the total source current and the total sink current is selectively to the one or more output nodes based on the one or more input signals.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments.

Figure 1:
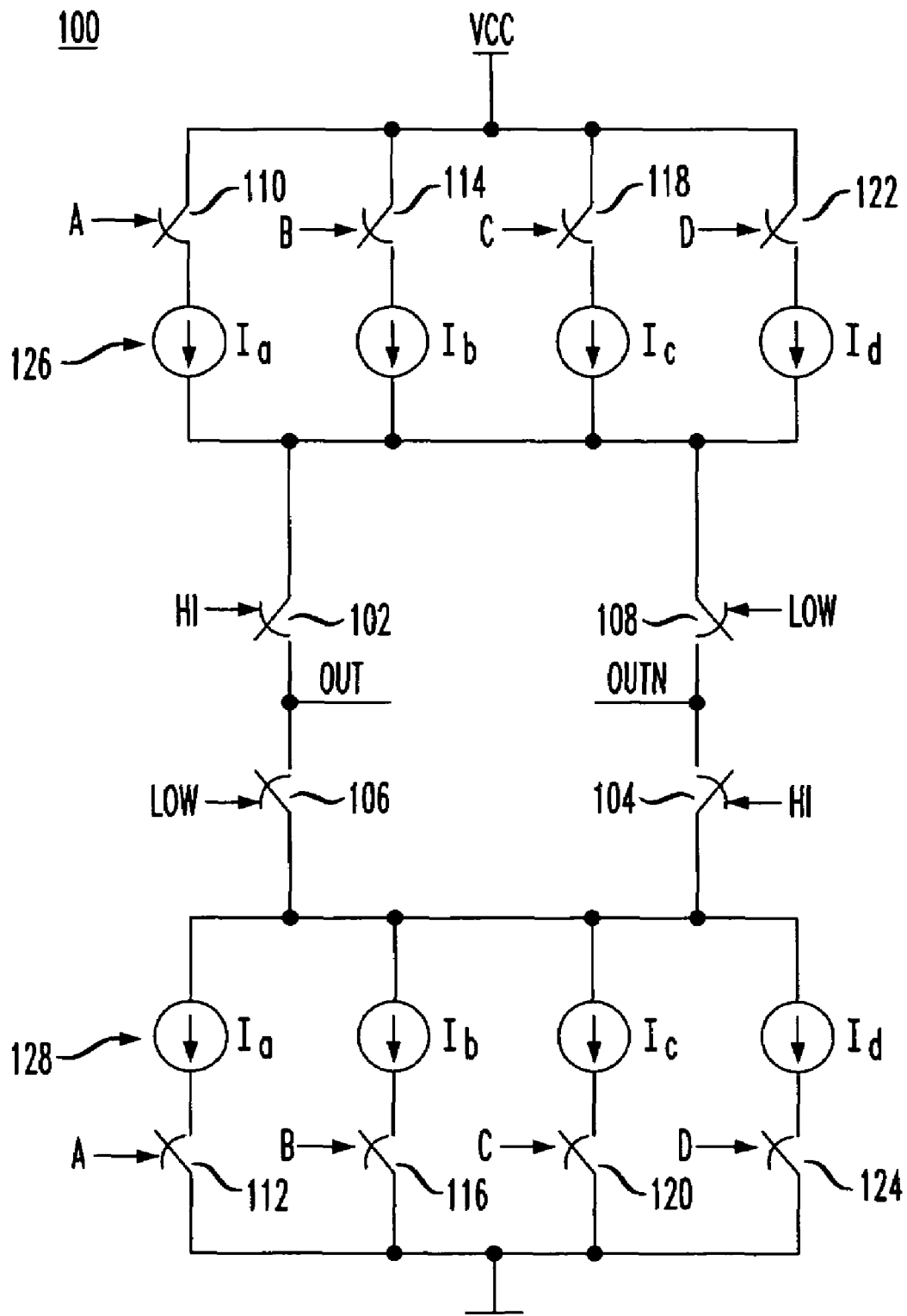
FIG. 1 shows a schematic diagram of a portion of a differential buffer, according to one embodiment of the present invention.

FIG. 1 shows a schematic diagram of a portion of a differential buffer 100, according to one embodiment of the present invention. Differential buffer 100 is typically part of a larger integrated circuit, such as an FPGA, which may have, in addition to other circuitry, multiple instances of differential buffer 100. Differential buffer 100 receives a differential input signal (HI, LOW) and generates a corresponding differential output signal (OUT, OUTN). Input signal HI is applied to control the state (i.e., open or closed) of input switches 102 and 104, while input signal LOW is applied to control the state of input switches 106 and 108. Under normal operating conditions, the values for input signals HI and LOW are controlled, such that input switches 102 and 104 are open, if input switches 106 and 108 are closed, and vice versa.

In addition, differential buffer 100 receives four control signals A, B, C, and D, where control signal A controls the state of current switches 110 and 112, control signal B controls the state of current switches 114 and 116, control signal C controls the state of current switches 118 and 120, and control signal D controls the state of current switches 122 and 124, where the state of each pair of current switches is independently controllable by its corresponding control signal.

Depending on which pairs of current switches are closed, different total source and sink currents are applied to the input terminals of input switches 102–108. In general, the total source current and the total sink current can be any additive combination of one or more of the currents $I_a$, $I_b$, $I_c$, and $I_d$ generated by current sources 126 and current sinks 128, respectively.

If input switches 102 and 104 are open and input switches 106 and 108 are closed, then the total source current is applied to the output terminal of switch 108 at output node OUTN, and the total sink current is applied to the output terminal of switch 106 at output node OUT. (Note that, in this specification, the same term (e.g., OUTN) may be used to refer to a node and to the signal that appears at that node.) Similarly, if input switches 102 and 104 are closed and input switches 106 and 108 are open, then the total source current is applied to the output terminal of switch 102 at output node OUT, and the total sink current is applied to the output terminal of switch 104 at output node OUTN.

Figure 2:
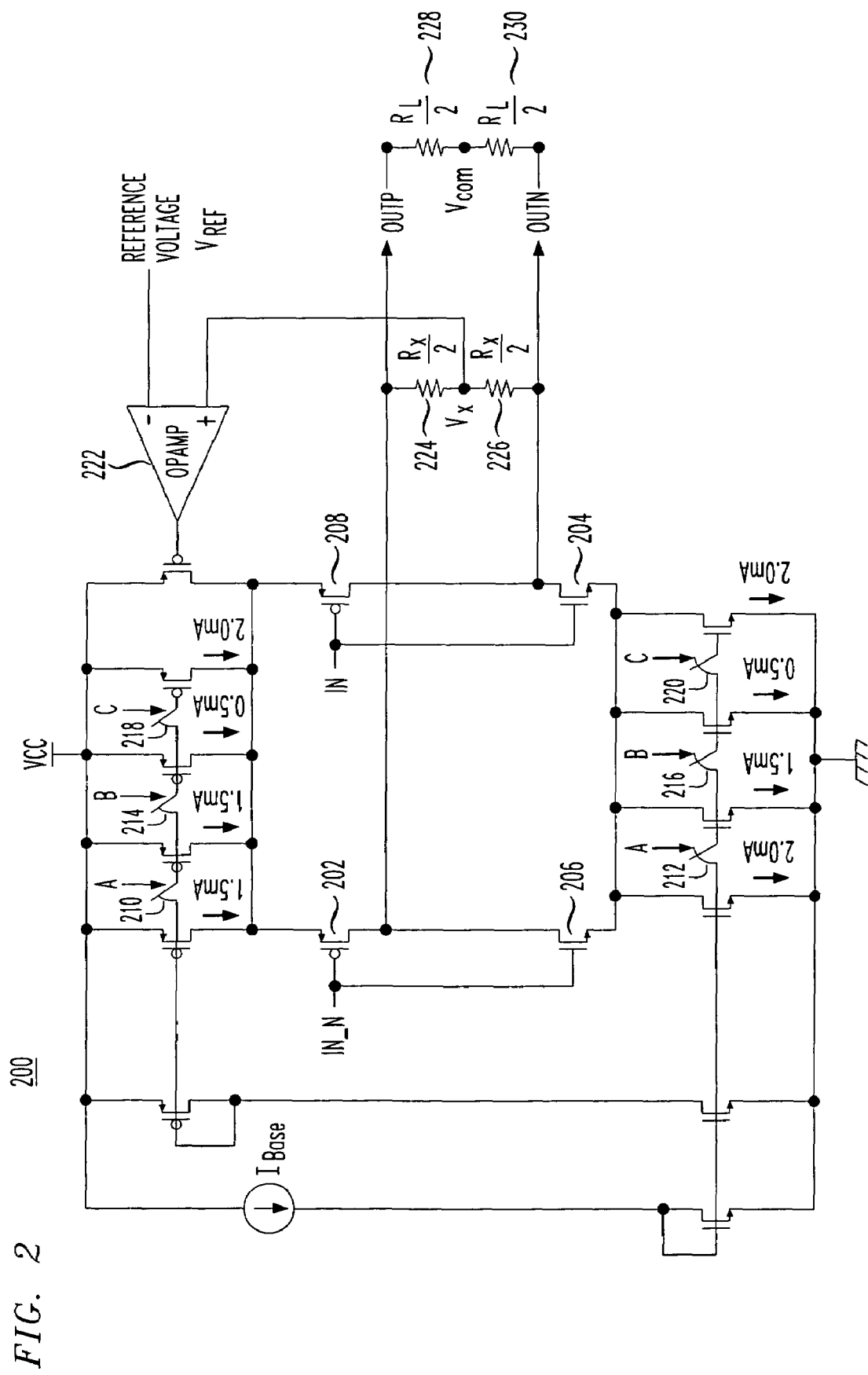
FIG. 2 shows a more detailed and more complete schematic diagram of a differential buffer, according to another embodiment of the present invention.

FIG. 2 shows a more detailed and more complete schematic diagram of a differential buffer 200, according to another embodiment of the present invention. Differential buffer 200 receives a differential input signal (IN, IN_N), where IN and IN_N are rail-to-rail complementary input signals, and generates a corresponding output signal (OUTP, OUTN), where OUTP and OUTN are complementary output signals relative to a common-mode voltage $V_{com}$. The input signal IN_N is applied to control the state of input switch devices 202 and 206, while the input signal IN is applied to control the state of input switch devices 204 and 208, where input switch devices 202–208 are functionally equivalent to input switches 102–108 of FIG. 1. As in differential buffer 100 of FIG. 1, under normal operating conditions, if input switch devices 202 and 204 are on (equivalent to switch closed), then input switches 206 and 208 are off (equivalent to switch open), and vice versa.

In addition, differential buffer 200 receives three control signals A, B, and C, where control signal A controls the state of current switches 210 and 212, control signal B controls the state of current switches 214 and 216, and control signal C controls the state of current switches 218 and 220. Note that current switches 210–220 are similar to, but not functionally identical to current switches 110–124 of FIG. 1.

Differential buffer 200 supports a smaller number of different total source and sink currents than does differential buffer 100 of FIG. 1. In particular, if all of switches 210–220 are open, then the total source and sink currents are both 2 mA, where $I_{Base}$ is the basic current for the entire block (e.g., 50 μA). Note that operational amplifier 222 supplies approximately 500 μA so that the total source current (PMOS in this implementation) matches the total sink current (NMOS in this implementation). If switches 210–212 are closed, then the total source and sink currents are both 3.5 mA. Similarly, if switches 210–216 are closed, then the total source and sink currents are both 4 mA, and lastly, if switches 210–220 are all closed, then the total source and sink currents are both 6 mA. Note that, if switches 210–212 are open, then the states of switches 214–220 are irrelevant (i.e., do not affect the total source and sink currents). Similarly, if switches 214–216 are open, then the states of switches 218–220 are irrelevant.

If input switch devices 202 and 204 are off and input switch devices 206 and 208 are on, then the total source current is applied to the output terminal of switch device 208 at output node OUTN, and the total sink current is applied to the output terminal of switch 206 at output node OUTP. Similarly, if input switch devices 202 and 204 are on and input switch devices 206 and 208 are off, then the total source current is applied to the output terminal of switch device 202 at output node OUTP, and the total sink current is applied to the output terminal of switch device 204 at output node OUTN.

As shown in FIG. 2, resistors 224–230 convert the source and sink currents applied to output nodes OUTP and OUTN into a differential output voltage signal (OUTP, OUTN). In order to minimize current loss within differential buffer 200, resistors 224 and 226 preferably have a much greater resistance value than resistors 228 and 230 (i.e., $R_X >> R_L$), which results in the current passing through reference resistors 224 and 226 being much less than the current passing through load resistors 228 and 230. OPAMP 222 forces the common-mode voltage $V_{com}$ to a desired level (e.g., based on input reference voltage $V_{REF}$), where the common-mode voltage $V_{com}$ and the sampled voltage $V_X$ are approximately the same (e.g., within circuit tolerances).

Differential buffer 200 can be configured to support (at least) the following different signaling applications:

Low-Voltage Differential Signaling (LVDS), which operates at a 3.5 mA current level and a 1.2V common mode;

Reduced-Signal Differential Swing (RSDS), which operates at a 2 mA current level and a 1.2V common mode; and Hyper Transport, which operates at a 6 mA current level and a 0.6V common mode.

In general, differential buffer 200 can support all four different current levels at either 1.2V or 0.6V common mode by controlling the states of switches 210–220 and the level of reference voltage $V_{REF}$.

In certain implementations, such as FPGAs, the control signals (e.g., signals A–D in FIG. 1 and signals A–C in FIG. 2) can be programmably selected by the user after the device is enabled. This enables the use to interactively change the output current levels, and thus the output voltage swing, to selectively conform to a different signaling application.

In general, the invention can be implemented in the context of differential buffers that receive either differential or non-differential input signals and generate either differential or non-differential output signals, in any combination.

Although the present invention has been described in the context of a differential amplifier in which an opamp "assists" the current sources, the invention could also be implemented in the context of differential amplifiers in which an opamp assists the current sinks.

As used in this specification, the term "channel node" refers generically to either the source or drain of a metal-oxide semiconductor (MOS) transistor device. Similarly, as used in the claims, the terms "source," "drain," and "gate" should be understood to refer either to the source, drain, and gate of an MOS device or to the collector, emitter, and base of a bi-polar device when the present invention is implemented using bi-polar transistor technology.

Although the present invention has been described in the context of FPGAs, those skilled in the art will understand that the present invention can be implemented in the context of other types of programmable devices, such as, without limitation, programmable logic devices (PLDs), mask-programmable gate arrays (MPGAs), simple programmable logic device (SPLDs), and complex programmable logic devices (CPLDs). More generally, the present invention can be implemented in the context of any kind of electronic device having programmable elements.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

We claim:

1. A programmable device having a buffer, the buffer comprising:

source current circuitry comprising a plurality of current sources adapted to be programmably controlled to sequentially generate a plurality of different total source currents;

sink current circuitry comprising a plurality of current sinks adapted to be programmably controlled to sequentially generate a plurality of different total sink currents;

one or more input nodes adapted to receive one or more input signals;

one or more output nodes adapted to present one or more output signals; and switch circuitry adapted to selectively apply at least one of a total source current and a total sink current to the one or more output nodes based on the one or more input signals.

2. The invention of claim 1, wherein:
the buffer is a differential buffer;
the one or more input nodes comprise first and second input nodes adapted to receive first and second input signals;
the one or more output nodes comprise first and second output nodes adapted to present first and second output signals; and
the switch circuitry is adapted to selectively apply either (1) the total source current to the first output node and the total sink current to the second output node or (2) the total source current to the second output node and the total sink current to the first output node.

3. The invention of claim 1, further comprising an operational amplifier adapted to contribute current to either the total source current or the total sink current.

4. The invention of claim 3, wherein the operational amplifier is adapted to (1) receive a reference voltage signal and a sampled voltage signal corresponding to a common-mode voltage for the buffer and (2) generate an opamp output signal that drives the sampled voltage signal towards the reference voltage signal.

5. The invention of claim 1, wherein:
the source current circuitry comprises:
N current source devices connected in parallel at their channel nodes; and
N−1 switches, each switch connected between the gates of a different pair of adjacent current source devices; and
the sink current circuitry comprises:
M current sink devices connected in parallel at their channel nodes; and
M−1 switches, each switch connected between the gates of a different pair of adjacent current sink devices.

6. The invention of claim 5, wherein:
the N current source devices comprises an unswitched, first current source device and N−1 switched current source devices; and
the M current sink devices comprises an unswitched, first current sink device and N−1 switched current sink devices.

7. The invention of claim 6, wherein:
the first current source device generates a first source current having a magnitude different from a first sink current generated by the first current sink device; and
each switched current source device generates a switched source current having a magnitude substantially equal to a switched sink current generated by a corresponding switched current sink device.

8. The invention of claim 7, further comprising an operational amplifier adapted to contribute a current having a magnitude substantially equal to a difference between the magnitude of the first source current and the magnitude of the first sink current.

9. The invention of claim 5, wherein:
the N−1 switches are independently programmable; and
the M−1 switches are independently programmable.

10. The invention of claim 1, wherein:
the source current circuitry comprises N switched current sources connected in parallel; and
the sink current circuitry comprises M switched current sinks connected in parallel.

11. The invention of claim 10, wherein:
each switched current source comprises a switch and a current source device connected in series; and
each switched current sink comprises a switch and a current sink device connected in series.

12. The invention of claim 10, wherein:
the N switched current sources are independently programmable; and
the M switched current sources are independently programmable.

13. The invention of claim 1, further comprising an output load adapted to convert each output signal from a current signal into a voltage signal.

14. The invention of claim 13, wherein the voltage signals corresponding to the different total current sources and different total current sinks correspond to a plurality of different signaling applications.

15. The invention of claim 14, wherein:
the plurality of different signaling applications comprise LVDS, RSDS, and Hyper Transport; and
the programmable device is implemented as a single integrated circuit.

16. A method for processing an input signal to present an output signal at one or more output nodes, the method comprising:
programmably generating a total source current from among a plurality of different supported total source currents using source current circuitry comprising a plurality of current sources adapted to be programmably controlled to sequentially generate the plurality of different supported total source currents;
programmably generating a total sink current from among a plurality of different supported total sink currents using sink current circuitry comprising a plurality of current sinks adapted to be programmably controlled to sequentially generate the plurality of different supported total sink currents; and
selectively applying at least one of the total source current and the total sink current to the one or more output nodes based on the one or more input signals.

17. The invention of claim 16, wherein:
the output signal is presented at two output nodes; and
the total source current and the total sink current are selectively applied to the two output nodes based on the input signal.

18. An apparatus for processing an input signal to present an output signal at one or more output nodes, the apparatus comprising:
means for programmably generating a total source current from among a plurality of different supported total source currents, said means comprising a plurality of current sources adapted to be programmably controlled to sequentially generate the plurality of different supported total source currents;
means for programmably generating a total sink current from among a plurality of different supported total sink currents, said means comprising a plurality of current sinks adapted to be programmably controlled to sequentially generate the plurality of different supported total sink currents; and
means for selectively applying at least one of the total source current and the total sink current to the one or more output nodes based on the one or more input signals.

19. The invention of claim 18, wherein:
the output signal is presented at two output nodes; and
the total source current and the total sink current are selectively applied to the two output nodes based on the input signal.

* * * * *